US012743563B2

(12) United States Patent
Maiti et al.

(10) Patent No.: US 12,743,563 B2
(45) Date of Patent: Sep. 22, 2026

(54) SYSTEMS AND METHODS FOR MULTI-CONDITIONAL BATTERY CONFIGURATION

(71) Applicant: The Boeing Company, Chicago, IL (US)

(72) Inventors: Nayan Maiti, Kolkata (IN); Sharon Filipowski Arroyo, Sammamish, WA (US)

(73) Assignee: THE BOEING COMPANY, Arlington, VA (US)

( * ) Notice: Subject to any disclaimer, the term of this patent is extended or adjusted under 35 U.S.C. 154(b) by 1238 days.

(21) Appl. No.: 17/646,814

(22) Filed: Jan. 3, 2022

(65) Prior Publication Data

US 2022/0309210 A1 Sep. 29, 2022

Related U.S. Application Data

(60) Provisional application No. 63/165,314, filed on Mar. 24, 2021.

(51) Int. Cl.
*G06F 30/20* (2020.01)
*H01M 50/583* (2021.01)

(52) U.S. Cl.
CPC .......... *G06F 30/20* (2020.01); *H01M 50/583* (2021.01); *H01M 2200/103* (2013.01)

(58) Field of Classification Search
CPC ................ G06F 30/20; H01M 50/583; H01M 2200/103

(Continued)

(56) References Cited

U.S. PATENT DOCUMENTS 4,297,639 A * 10/1981 Branham ........... G01R 31/3646 324/428
5,939,217 A * 8/1999 Tamura ............. H01M 50/3425 429/61

(Continued)

OTHER PUBLICATIONS

Zhang et al. (Multi-objective optimization of lithium-ion battery model using genetic algorithm approach, Journal of Power Sources 270 (2014), pp. 367-378) (Year: 2014).*

(Continued)

*Primary Examiner* — Iftekhar A Khan
(74) *Attorney, Agent, or Firm* — MH2 Technology Law Group LLP

(57) ABSTRACT

A computer system that determines cell-fuse pair placement in a multi-conditional battery configuration is provided. A processor performs operations including receiving cell data, receiving fuse data, generating a population comprising a plurality of placement solutions for the battery configuration, each placement solution comprising a plurality of battery modules, each battery module comprising a plurality of virtual cells comprising a plurality of positions at which a cell-fuse pair is placed, determining, for each virtual cell of each placement solution, a condition value for each condition of the multi-conditional configuration, the condition value being based on the characteristic cell values and the characteristic fuse values, generating one or more new solutions from the population based on genetic algorithm breeding, for consideration as a survivor solution, and providing at least one of a selected survivor solution or a selected placement solution corresponding to a cell-fuse pair placement configuration satisfying a predetermined condition.

20 Claims, 9 Drawing Sheets

(58) Field of Classification Search
USPC .............................................................. 703/7
See application file for complete search history.

(56) References Cited

U.S. PATENT DOCUMENTS

| | | | | | |
|---|---|---|---|---|---|
| 6,099,986 | A * | 8/2000 | Gauthier | H01M 50/574 | 429/7 |
| 6,291,972 | B1 * | 9/2001 | Zhang | H02J 7/56 | 320/118 |
| 6,844,703 | B2 * | 1/2005 | Canter | B64G 1/428 | 320/131 |
| 8,065,111 | B1 * | 11/2011 | Gonzalez | F42B 10/42 | 702/182 |
| 8,133,287 | B2 * | 3/2012 | Hermann | H01M 50/583 | 29/623.1 |
| 8,133,608 | B2 * | 3/2012 | Hermann | H01M 10/4264 | 320/133 |
| 8,758,924 | B2 * | 6/2014 | Tennessen | B60L 50/64 | 429/120 |
| 9,160,163 | B2 * | 10/2015 | Fink | H02H 7/18 | |
| 9,806,545 | B2 * | 10/2017 | Fink | H02J 7/60 | |
| 10,026,948 | B2 * | 7/2018 | Kohlberger | H01M 50/553 | |
| 10,186,739 | B2 * | 1/2019 | Ng | H01M 10/0422 | |
| 10,318,656 | B2 * | 6/2019 | Cox | G06F 30/20 | |
| 10,445,449 | B2 * | 10/2019 | Cox | H01M 50/529 | |
| 10,992,149 | B1 * | 4/2021 | Kahn | H02J 7/50 | |
| 2002/0086578 | A1 * | 7/2002 | Ikeda | H01R 11/288 | 439/500 |
| 2003/0001716 | A1 * | 1/2003 | Kaltenborn | H01H 85/046 | 337/273 |
| 2005/0017682 | A1 * | 1/2005 | Canter | H02J 7/54 | 320/118 |
| 2005/0029867 | A1 * | 2/2005 | Wood | H02J 1/14 | 307/66 |
| 2005/0233210 | A1 * | 10/2005 | Horie | H01M 10/4207 | 429/61 |
| 2007/0145950 | A1 * | 6/2007 | Wang | H02J 1/14 | 320/134 |
| 2007/0188147 | A1 * | 8/2007 | Straubel | B60L 3/04 | 320/134 |
| 2009/0167312 | A1 * | 7/2009 | Keates | G01R 31/52 | 320/162 |
| 2009/0184685 | A1 * | 7/2009 | Sim | H02J 7/963 | 320/134 |
| 2011/0134934 | A1 * | 6/2011 | Arroyo | H04L 47/2425 | 370/431 |
| 2011/0228436 | A1 * | 9/2011 | Lee | H01M 50/20 | 429/61 |
| 2012/0046776 | A1 * | 2/2012 | Zhang | H01M 10/052 | 700/106 |
| 2013/0049697 | A1 * | 2/2013 | Li | H02J 7/663 | 320/134 |
| 2013/0110429 | A1 * | 5/2013 | Mitsuyama | G01R 31/367 | 702/63 |
| 2014/0077765 | A1 * | 3/2014 | Gao | H02J 7/00 | 320/126 |
| 2014/0312828 | A1 * | 10/2014 | Vo | H02J 7/575 | 429/7 |
| 2016/0028128 | A1 * | 1/2016 | Limvorapun | B64G 1/425 | 429/61 |
| 2016/0241058 | A1 * | 8/2016 | Carralero | H02J 7/52 | |
| 2017/0108553 | A1 * | 4/2017 | Ganesan | G01R 31/396 | |
| 2017/0308623 | A1 * | 10/2017 | Cox | G06F 30/00 | |
| 2018/0097396 | A1 * | 4/2018 | Qi | H01M 10/425 | |
| 2018/0254651 | A1 * | 9/2018 | Hallmark | H01M 10/425 | |
| 2019/0310321 | A1 * | 10/2019 | Mi | G01R 31/44 | |
| 2019/0325316 | A1 * | 10/2019 | Anderson | G06N 3/086 | |
| 2020/0036047 | A1 * | 1/2020 | Aikens | H01M 50/249 | |
| 2020/0203702 | A1 * | 6/2020 | Park | H01M 50/581 | |
| 2020/0412159 | A1 * | 12/2020 | Snyder | H01M 10/482 | |
| 2022/0029431 | A1 * | 1/2022 | McLean | H02J 7/54 | |

OTHER PUBLICATIONS

Deb et al., "A Fast and Elitist Multiobjective Genetic Algorithm: NSGA-II," IEEE Transactions on Evolutionary Computation, vol. 6, No. 2, Apr. 2002.

* cited by examiner

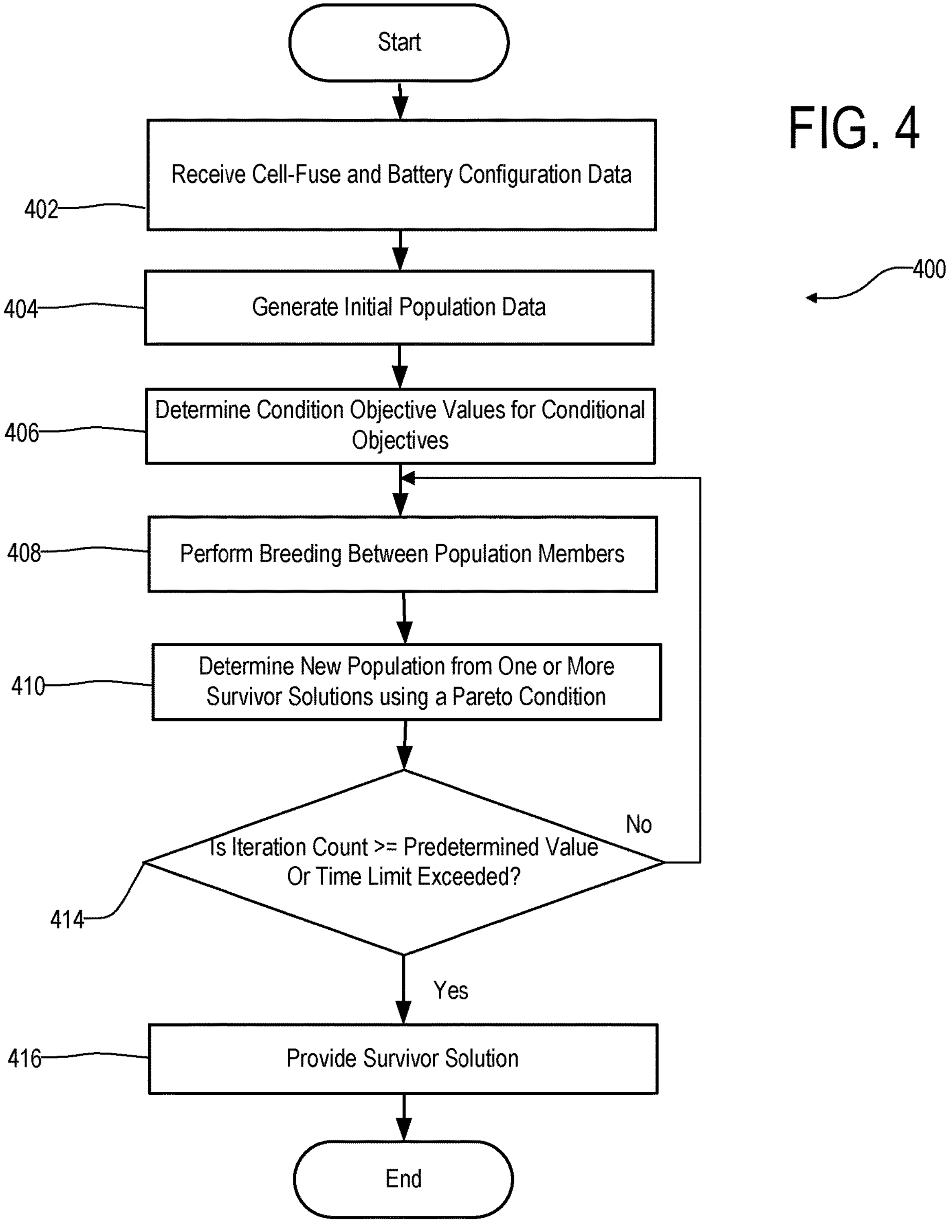
Start
Receive Cell-Fuse and Battery Configuration Data
402
Generate Initial Population Data
404
Determine Condition Objective Values for Conditional Objectives
406
Perform Breeding Between Population Members
408
Determine New Population from One or More Survivor Solutions using a Pareto Condition
410
Is Iteration Count >= Predetermined Value Or Time Limit Exceeded?
No
414
Yes
Provide Survivor Solution
416
End
FIG. 4
400

SYSTEMS AND METHODS FOR MULTI-CONDITIONAL BATTERY CONFIGURATION

CROSS-REFERENCE TO RELATED APPLICATIONS

This application claims priority to U.S. Provisional Patent Application No. 63/165,314, filed on Mar. 24, 2021, the entirety of which is incorporated by reference herein.

FIELD

The subject disclosure relates to systems and methods for battery configuration determination.

BACKGROUND

Batteries fabricated from multiple modules connected, for example, in series, each module having a plurality of cells connected in parallel, are frequently used as a power source. In such multi-cell batteries, the connection to another cell is accomplished via a fuse, and each of the cells can typically be characterized by cell capacity, cell impedance, and fuse impedance.

Small differences in capacity and/or impedance between the cells of a multi-cell battery (e.g., due to production tolerances or operating conditions) can be magnified with each charge or discharge cycle. In these situations, weaker cells can be over-stressed during charging, causing them to become even weaker, until they eventually fail and cause a premature failure of the battery. Similarly, stronger cells can be under-stressed and/or undercharged, thereby leading to lack of utilization of such cells to full capability.

Cell balancing (also known as cell allocation) in the multi-cell batteries can aid in compensating for these weaker cells by equalizing the charge on all the cells in the chain, thus extending the battery life. However, determining a cell-fuse allocation within the multi-cell battery is a complex non-linear combinatorial problem, for at least the reason that a large number of possible combinations exist and each cell can only be placed in at most one unit location and each location needs to be occupied by a cell.

SUMMARY

The following presents a simplified summary of the disclosure in order to provide a basic understanding of some aspects of one or more implementations of the subject disclosure. This summary is not an extensive overview, nor is it intended to identify key or critical elements of the subject disclosure, nor to delineate the scope of the disclosure. Rather, its primary purpose is merely to present one or more concepts in simplified form as a prelude to the detailed description presented later.

The present inventors have recognized that improvements in battery longevity and performance can be obtained by improving cell-fuse placement configuration within a multi-cell battery.

According to embodiments of the subject disclosure, a computer system that determines cell-fuse pair placement in a multi-conditional battery configuration is provided. The computer system includes one or more hardware processors and a non-transitory memory device communicatively connected to the one or more hardware processors and storing instructions that when executed by the one or more hardware processors cause the one or more hardware processors to execute operations. The operations include receiving cell data comprising one or more characteristic cell values related to each of a plurality of cells, receiving fuse data comprising one or more characteristic fuse values related to each of a plurality of fuses, generating a population comprising a plurality of candidate placement solutions for the battery configuration based on an initial sorted sequence of the cell data and the fuse data, each candidate placement solution comprising a plurality of battery modules, each battery module comprising a plurality of virtual cells, and each virtual cell comprising a plurality of positions at which a cell-fuse pair selected from the plurality of cells and the plurality of fuses is placed, determining, for each virtual cell of each candidate placement solution of the population, a condition value for each condition of the multi-conditional configuration, the condition value being based on the characteristic cell values and the characteristic fuse values of the cell-fuse pairs placed in the positions of the virtual cell, generating one or more new solutions from the population based on genetic algorithm breeding, for consideration as a survivor solution, and providing, to a user device, at least one of a selected survivor solution or a selected candidate placement solution corresponding to a cell-fuse pair placement configuration satisfying a predetermined condition based on the determined condition values for each condition of the multi-conditional configuration for each virtual cell.

By providing such a system it becomes possible to rapidly improve a battery design based on data available for components of the battery, resulting in improved durability of the assembled battery, as well as improved output. In addition, by configuring as recited, the computer system can operate as a special purpose computer system for determining cell-fuse pair placement.

According to further embodiments, a method that determines cell and fuse placement in a multi-conditional battery configuration is provided. The method includes receiving cell data comprising one or more characteristic cell values related to each of a plurality of cells, receiving fuse data comprising one or more characteristic fuse values related to each of a plurality of fuses, generating a population comprising a plurality of candidate placement solutions for the battery configuration based on an initial sorted sequence of the cell data and the fuse data, each candidate placement solution comprising a plurality of battery modules, each battery module comprising a plurality of virtual cells, and each virtual cell comprising a plurality of positions at which a cell-fuse pair selected from the plurality of cells and the plurality of fuses is placed, determining, for each virtual cell of each candidate placement solution of the population, a condition value for each condition of the multi-conditional configuration, the condition value being based on the characteristic cell values and the characteristic fuse values of the cell-fuse pairs placed in the positions of the virtual cell, generating one or more new solutions from the population based on genetic algorithm breeding, for consideration as a survivor solution, and providing, to a user device, at least one of a selected survivor solution or a selected candidate placement solution corresponding to a cell-fuse pair placement configuration meeting a predetermined condition based on the determined condition values for each condition of the multi-conditional configuration for each virtual cell.

By providing such a method it becomes possible to rapidly improve a battery design based on data available for components of the battery, resulting in improved durability of the assembled battery, as well as improved output.

It is intended that combinations of the above-described elements and those within the specification can be made, except where otherwise contradictory.

It is to be understood that both the foregoing general description and the following detailed description are illustrative and explanatory only and are not to be considered limiting.

BRIEF DESCRIPTION OF THE FIGURES

The accompanying drawings, which are incorporated in, and constitute a part of, this specification, illustrate implementations of the present teachings and, together with the description, serve to explain the principles of the disclosure.

FIG. 4 is a flowchart illustrating a method for multi-conditional battery configuration according to embodiments of the subject disclosure;

It should be noted that some details of the figures have been simplified and are drawn to facilitate understanding of the present teachings rather than to maintain strict structural accuracy, detail, and scale.

DETAILED DESCRIPTION

Reference will now be made in detail to illustrative implementations of the subject disclosure, examples of which are illustrated in the accompanying drawings. Wherever convenient, the same reference numbers will be used throughout the drawings to refer to the same or like elements (e.g., components, steps, processes, or parts).

Embodiments of the subject disclosure relate to methods, computer systems, and computer-readable media that store instructions for determining cell-fuse pair placement in a multi-cell, multi-conditional battery configuration. Particularly, the subject disclosure is directed toward implementations of a genetic algorithm for determining cell-fuse placement for a plurality of cell-fuse pairs connected within a battery and installed within a plurality of battery modules.

In a genetic algorithm, a population of candidate solutions to a configuration problem can be evolved toward better solutions. Each candidate solution corresponds to a chromosome of the population and has a set of properties ("genes") which can be "mutated" and altered to form a new chromosome (i.e., candidate solution). The evolution can be performed based on a population of randomly generated candidate solutions and can be performed iteratively to form generations corresponding to a population after each iteration. In each generation, the fitness of each candidate solution is evaluated, fitness corresponding to a value of an objective function in the configuration problem being solved. Candidate solutions having greater fitness can be selected (e.g., stochastically) from a current generation, and each candidate solution's chromosomes modified (e.g., recombined and possibly randomly mutated) to form a new generation. A new generation of candidate solutions is then used in the next iteration. Commonly, the algorithm terminates when either an execution time limit expires, a maximum number of generations has been produced, and/or a satisfactory fitness level, as defined by one or more fitness criteria, has been reached for the population.

Figure 1:
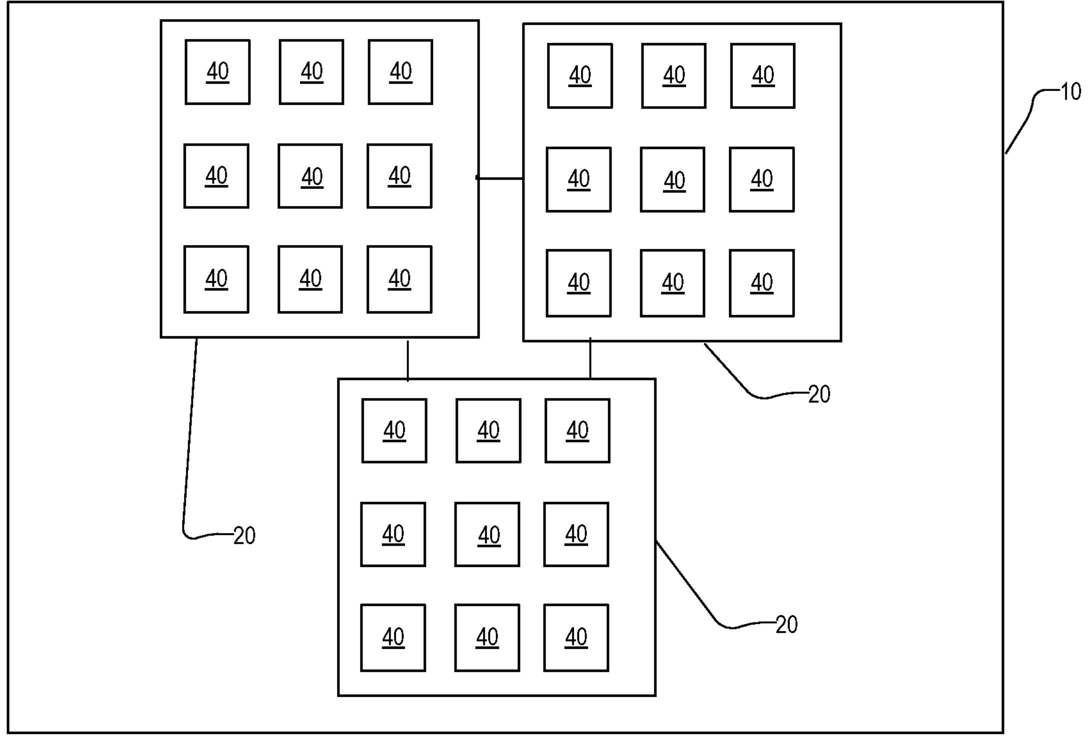
FIG. 1 is an illustrative battery including a plurality of battery modules each including a plurality of positions for cell-fuse pair placement, according to embodiments of the subject disclosure.

FIG. 1 is a logical depiction of an illustrative battery 10 including a plurality of battery modules 20 including a plurality of positions 40 for cell-fuse pair placement, within each module 20, according to embodiments of the subject disclosure. According to embodiments of the subject disclosure, a battery 10 comprises a plurality of battery modules 20, which can be interconnected for example in parallel or in series (e.g., via bus bars) for purposes of providing output from the battery. Any number of modules 20 can be provided within a particular battery, based on, for example, a desired output and a desired configuration. Further, modules 20 can take any suitable shape for a particular implementation, and the shapes shown and described herein are not intended to be limiting.

Each battery module 20 includes a plurality of positions 40 at which a cell-fuse pair 50 can be placed and connected to other cell-fuse pairs 50 positioned within the battery module 20. For example, according to some embodiments, each battery module 20 can include nine positions 40, each position 40 being configured to accept one cell-fuse pair 50. Importantly, the number of positions 40 within each module 20 and within each battery described herein are intended as illustrative only and not as limiting. A battery 10 and/or an individual module 20 can comprise more or fewer positions 40 configured to accept a cell-fuse pair 50 for a desired implementation and output. For example, a first module 20 may be configured with nine positions, a second module 20 may be configured with twelve positions 40, and a third module 20 may be configured with 6 positions 40. Notably, however, positions 40 are configured to accept only a single cell-fuse pair.

Figure 2A:
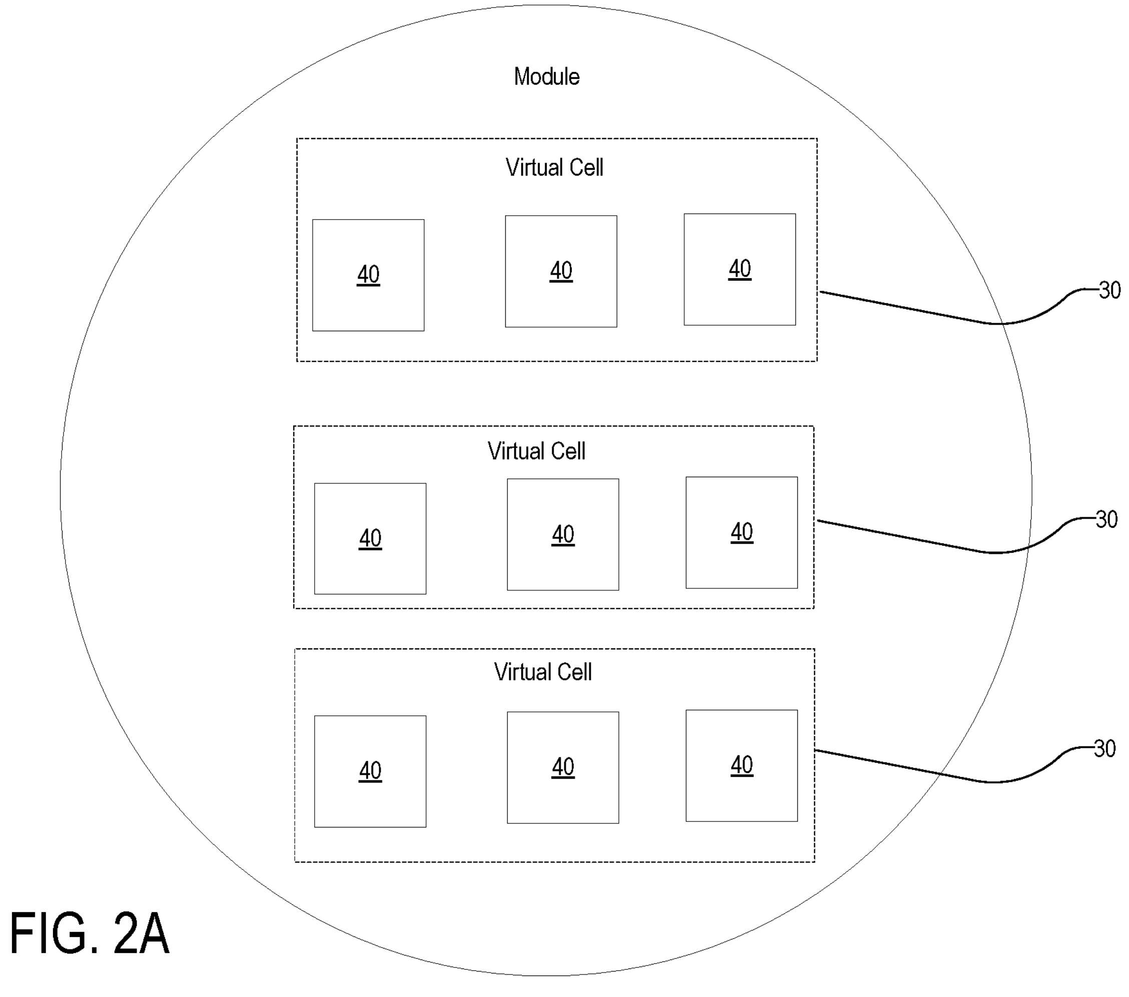
FIG. 2A is a logical diagram of a single, illustrative module including a plurality of virtual cells, each virtual cell including a plurality of cell-fuse pairs.

FIG. 2A is a logical diagram of a single, illustrative module 20 including a plurality of virtual cells 30, each virtual cell 30 being configured to logically group a plurality of positions 40 configured to receive a single cell-fuse pair 50 per position 40. For purposes of the subject disclosure, a virtual cell 30 is configured to comprise a predetermined number of positions 40 within a module 20. For purposes of the subject disclosure, examples are described having three positions 40 allotted to each virtual cell 30, however, this is illustrative only and not intended as limiting. The number of positions 40 encompassed within a virtual cell 30 can be chosen as desired, for example, three, four, five or more positions 40 within each virtual cell 30. As will be described in greater detail below, the number of positions allotted to each virtual cell 30 can determine the size of an array used for performing determinations consistent with embodiments of the subject disclosure.

Figure 2B:
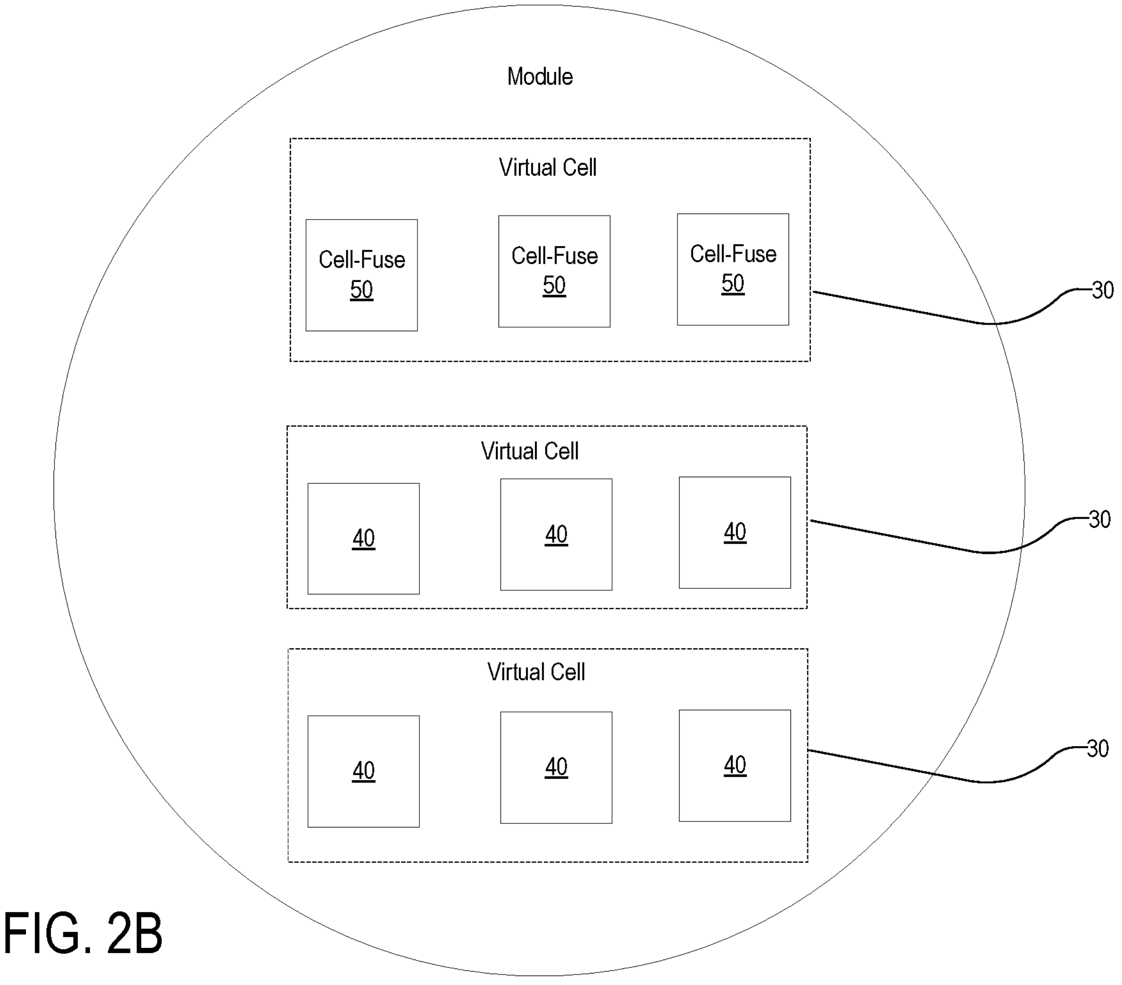
FIG. 2B shows the logical module diagram of FIG. 2A, wherein positions of a first virtual cell have been filled with cell-fuse pairs according to a first partial candidate solution.

FIG. 2B shows the logical module diagram of FIG. 2A, wherein positions 40 of a first virtual cell 30 have been filled with cell-fuse pairs 50 according to a first candidate solution.

A cell of a cell-fuse pair 50 can comprise any suitable battery cell of any suitable output. For example, a cell of cell-fuse pair 50 can comprise a lithium-ion cell a nickel-metal hydride cell, a lead-acid cell, etc. For purposes of the subject disclosure, cells shall be understood to be lithium-ion cells, however, this is intended as illustrative only, and not intended to be limiting.

Each cell of a cell-fuse pair 50 can be characterized by multiple parameters related to an electrical profile associated with the cell. Such parameters can include, for example, voltage measured in volts (V), a capacity measured in amp hours (Ahr), and an impedance measured in Ohms (Ω), among others.

One cell-fuse pair 50 can be placed in each position 40 within a battery module 20, and can be connected to other cells of the module 20, for example, in series or in parallel. Such connections can be achieved via the fuse of the cell-fuse pair 50, for example. One single configuration, i.e., an assembled battery having a cell-fuse pair 50 assigned to each available position 40 within all battery modules 20, is considered a "candidate solution" of the battery configuration for purposes of the genetic algorithm and description herein.

Each fuse of a cell-fuse pair 50 can comprise any suitable electrically conductive material and can be characterized by impedance as measured in Ohms (Ω). Each fuse can further be configured to limit an amount of current permitted to be transmitted through the fuse from the paired cell, for example, by failure of the fuse in the event of an over-current.

Figure 3:
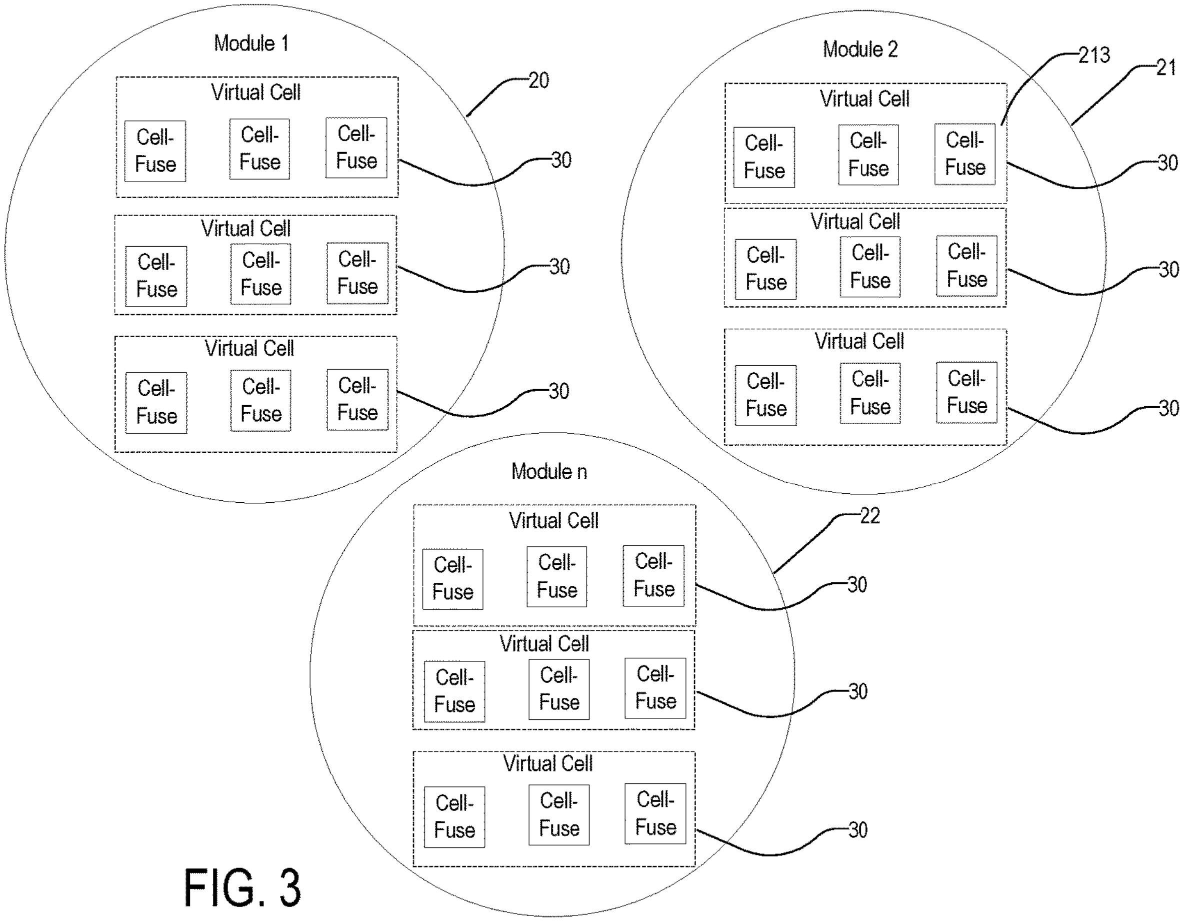
FIG. 3 is a logical diagram of a battery including three modules according to FIG. 2A.

As noted above for each position 40 a single cell-fuse pair can be positioned therein. FIG. 3 is a logical diagram of a battery including three modules 20-22 according to FIG. 2A, each module 20 comprises three virtual cells 30, and each virtual cell 30 is allotted three positions 40 for placement of a cell-fuse pair 50. In the example of FIG. 3, the positions 40 have been filled with cell-fuse pairs 50 to form a candidate solution of a population. In determining the desired battery placement configuration, it shall be understood that embodiments described herein seek to meet three conditional objectives with regard to the cell-fuse pairs 50 allotted to positions 40 within the virtual cells 30. The conditional objectives correspond to the fitness criteria associated with the genetic algorithm and can be defined as follows: 1) reduce (e.g., minimize) a difference in capacity across all virtual cells 30 (i.e., summed capacity of each cell-fuse pair allocated to a virtual cell 30); 2) reduce (e.g., minimize) a difference in impedance within each virtual cell 30; and 3) reduce (e.g., minimize) a difference in impedance across all modules 20 of the battery 10 (i.e., summed impedance from all virtual cells 30). One of skill will recognize that more or fewer objectives can be defined, and such objectives can differ, without departing from the scope of the subject disclosure.

For purposes of the following disclosure, the following Table 1 defining variable notation can aid in understanding the description.

TABLE 1

| | |
|---|---|
| $n_c$ | Number of cells |
| $n_f$ | Number of fuses |
| L | Number of positions 40 |
| $n_m$ | Number of modules 20 |

TABLE 1-continued

| | |
|---|---|
| $n_v$ | Number of virtual cells 30 |
| $n_{c_v}$ | Number of cells in a virtual cell |
| $n_{v_m}$ | Number of virtual cells in a module |
| C | Set of cells |
| F | Set of fuses |
| $C_i$ | Charge capacity of cell i |
| $C_k^v$ | Capacity sum of $k^{th}$ virtual cell |
| $I_j^c$ | Impedance of cell i |
| $I_j^f$ | Impedance of fuse j |
| l | Position 40 |

Thus, in view of the above, the number of positions for any particular battery can be defined as $L=n_m \times n_{v_m} \times n_{c_v}$. This leads to a position assignment configuration where each position $l \in \{1, 2, \ldots, L\}$ of a battery is assigned with a cell $c_l \in \{1, 2, \ldots, n_C\}$ and a fuse $f_l \in \{1, 2, \ldots, n_f\}$. As noted in the table above, $n_c$ and $n_f$ denote the total number of cells and fuses respectively.

Two sequences can then be used to represent a cell-fuse assignment as shown at 1) and 2).

$$\{c_1, c_2, \ldots, c_{n_{c_v}} c_{n_{c_v}+1}, c_{n_{c_v}+2}, \ldots c_{2n_{c_v}} \ldots c_{(n_v-1)n_{c_v}+1}, c_{(n_{c_v}-1)n_{c_v}+2}, \ldots, c_{n_v n_{c_v}}\} \quad (1$$

$$\{f_1, f_2, \ldots, f_{n_{c_v},} f_{n_{c_v}+1}, f_{n_{c_v}+2}, \ldots f_{2n_{c_v}} \ldots f_{(n_v-1)n_{c_v}+1}, f_{(n_{c_v}-1)n_{c_v}+2}, \ldots, f_{n_v n_{c_v}}\} \quad (2$$

$C_i$ references the charge capacity of a cell $c_i$, corresponding to the amount of energy that can be extracted from the cell, while $$I_i^c$$

references the internal impedance of cell $c_i$. Impedance of fuses is denoted as $$I_j^f.$$

Taking the first conditional objective, i.e., reduce a difference in capacity across all virtual cells 30, a total capacity measurement is defined as the sum of all cell capacities within the virtual cell 30. In other words, capacity for each cell-fuse pair 50 hypothetically placed within a virtual cell 30 can be summed with a capacity of the other cell-fuse pairs 50 hypothetically placed in positions 40 within the virtual cell 30 to obtain the total capacity for the virtual cell 30, as shown at equation 3.

$$C_k^v = \sum_{j=1}^{n_{c_v}} C_{(k-1)n_{c_v}+j} \quad (3$$

The difference in total capacity across all virtual cells 30 of a module is thus $$\max_{k\in\{1,\ldots,n_v\}}\{C_k^v\}-\min_{k\in\{1,\ldots,n_v\}}\{C_k^v\}.$$

The first conditional objective is therefore, represented as shown at equation 4.

$$\min_{\text{all cellfuse allocations}}\left\{\max_{k\in\{1,\ldots,n_v\}}\{C_k^v\}=\min_{k\in\{1,\ldots,n_v\}}\{C_k^v\}\right\} \quad (4$$

Taking the second conditional objective, i.e., reduce a difference in impedance within each virtual cell 30, $$d_i^I$$

can be used to reference the maximum impedance difference within the i$^{th}$ virtual cell 30. In this case, the maximum impedance difference in a virtual cell is:

$$d_i^I=\max_{j\in\{1,\ldots,n_{c_v}\}}\left\{I^c_{(i-1)n_{c_v}+j}+I^f_{(i-1)n_{c_v}+j}\right\}-\min_{j\in\{1,\ldots,n_{c_v}\}}\left\{I^c_{(i-1)n_{c_v}+j}+I^f_{(i-1)n_{c_v}+j}\right\}$$

With the above, the second conditional objective is defined as at equation 5.

$$\min_{allcell-fuseallocation}\left\{\max_{i\in\{1,\ldots,n_{v_c}\}}d_i^I\right\} \quad (5$$

Taking the third conditional objective, i.e., reducing a difference in impedance across all modules 20 of the battery 10, total impedance for a module is defined by equation 6.

$$\sum_{i=(k-1)n_{v_m}+1}^{(k)n_{v_m}}\frac{1}{\sum_{j=1}^{n_{c_v}}\frac{1}{\left(I^c_{(i-1)n_{c_v}+j}+I^f_{(i-1)n_{c_v}+j}\right)}} \quad (6$$

Further, the difference in total impedance across all modules 20 of the battery 10 is thus $$\max_{k\in\{1,\ldots,n_m\}}\left\{\sum_{i=(k-1)n_{v_m}+1}^{(k)n_{v_m}}\frac{1}{\sum_{j=1}^{n_{c_v}}\frac{1}{\left(I^c_{(i-1)n_{c_v}+j}+I^f_{(i-1)n_{c_v}+j}\right)}}\right\}-\min_{k\in\{1,\ldots,n_m\}}\left\{\sum_{i=(k-1)n_{v_m}+1}^{(k)n_{v_m}}\frac{1}{\sum_{j=1}^{n_{c_v}}\frac{1}{\left(I^c_{(i-1)n_{c_v}+j}+I^f_{(i-1)n_{c_v}+j}\right)}}\right\} \quad (6a$$

The third conditional objective is therefore, represented as shown at equation 7.

$$\min_{allcell-fuseallocation}\left\{\max_{k\in\{1,\ldots,n_m\}}\left\{\sum_{i=(k-1)n_{v_m}+1}^{(k)n_{v_m}}\frac{1}{\sum_{j=1}^{n_{c_v}}\frac{1}{\left(I^c_{(i-1)n_{c_v}+j}+I^f_{(i-1)n_{c_v}+j}\right)}}\right\}-\min_{k\in\{1,\ldots,n_m\}}\left\{\sum_{i=(k-1)n_{v_m}+1}^{(k)n_{v_m}}\frac{1}{\sum_{j=1}^{n_{c_v}}\frac{1}{\left(I^c_{(i-1)n_{c_v}+j}+I^f_{(i-1)n_{c_v}+j}\right)}}\right\}\right\} \quad (7$$

FIG. 4 is a flowchart 400 illustrating a method for multi-conditional battery configuration according to embodiments of the subject disclosure, and will be referred to with regard to certain aspects of the disclosure. As an example, the method can be performed at least in part by a system, for example system 600. According to embodiments of the subject disclosure, cell and fuse data defining characteristics of the cells and fuses, respectively, as well as desired characteristics of the battery 10 for which a configuration is to be determined can be provided by a user, for example, via data entry and/or data import (step 402). For example, a user interface can be provided to a user to enable input of capacity and impedance values associated with each cell and each fuse, among others, as well as values defining a desired number of battery modules 10, a virtual cell configuration (e.g., virtual cell count per battery module, number of cells per virtual cell, etc.), a desired population size of population candidates, an iteration count maximum, an execution time limit, etc. The user can then provide this information to the system via the interface and/or import tool prior to executing the system to determine a battery configuration.

Once the cell data, fuse data, and battery configuration data have been received, at 404, initial population data can be generated. For example, the system can commence execution of the battery configuration determination by first sorting the cell-fuse pairs based on, for example, cell capacities, cell impedances, etc., and based on the sorting, generating initial population data (e.g., a plurality of initial candidate solutions). According to some embodiments when an initial sorting by capacities is implemented, and cells assigned to positions 40 in the sorted order, the minimum and maximum capacity sums occur at the first and last virtual cell of any the ordered assignment scheme. This particular sorting scheme can thus be used to determine a baseline initial chromosome configuration of the population as concerns the capacity-based first conditional objective.

For example, taking a single module 20 of the battery of FIG. 3 consisting of nine positions 40, and a group of nine cell-fuse pairs 50 having capacities increasing linearly starting from 1, the cell-fuse pairs can be ordered by their capacity, which directly corresponds to the respective cell-fuse pair's ordinal identifier (i.e., 1, 2, 3, . . . , 8, 9). Assigning these cell-fuse pairs to the nine positions 40 in order provides a first baseline candidate solution, as evidenced by the following capacity sums per virtual cell 30, Virtual Cell 1: 1+2+3=6; Virtual Cell 2: 4+5+6=15; Virtual Cell 3: 7+8+9=24. Therefore, using the equation above for reducing (e.g., minimizing) capacity, 24–6=18, and this can be taken as a baseline candidate solution as concerns the first conditional objective, i.e., any other assignment configuration would yield a lesser difference in capacities across the virtual cells. Such a baseline candidate solution can benefit the algorithm in terms of providing diverse solutions.

In contrast, sorting can also be performed based on impedances of the cell-fuse pairs 50. In such a case, a second baseline scenario as concerns the second conditional objective (i.e., reduce, (e.g., minimize) a difference in impedance within each virtual cell 30) can be obtained, as evidenced by the following. Again, assuming a set of nine positions and nine cell-fuse pairs, the nine cell-fuse pairs 50 increasing in impedance linearly starting from 1 can be ordered by the impedance, which corresponds directly to the impedance of the respective cell-fuse pair 50 (i.e., 1, 2, . . . , 8, 9). Assigning these cell-fuse pairs 50 to the nine positions 40 in order provides a second baseline candidate solution, as evidenced by the following impedance difference across each virtual cell 30, Virtual Cell 1: 3−1=2; Virtual Cell 2: 6–4=2; Virtual Cell 3: 9–7=2. Therefore, using the equation above for reducing (e.g., minimizing) the difference in impedances across virtual cells, 2–2=0, and this can be taken as a second baseline candidate solution as concerns the second conditional objective, i.e., any other assignment configuration would yield a greater difference in impedance across virtual cells 30.

The first and/or second baseline candidate solutions can be used as a starting point for initial chromosomes (i.e., candidate solutions) within a first population of the genetic algorithm. For example, the first and/or second baseline candidate solutions can be used as a heuristic for seeding additional candidate solutions for an initial population of the genetic algorithm. Alternatively, or in addition, the initial population can be randomly generated based on the positions 40 to be filled and the list of cell-fuse pairs 50 provided by the user.

The initial population can be randomly generated (e.g., from the seed candidate solutions) up to a designated population size. For example, according to some embodiments, a population size can be set to between 26 and 100, for example, 52. The system can therefore perform random allocation of cell-fuse pairs 50 to fill all positions 40 of battery 10 for 52 different permutations to create the initial population candidate solutions.

Following generation of initial population candidate solutions (e.g., randomly, based on sorting, etc.) condition values (also referred to as conditional objective values) for each of the conditional objectives for each of the generated candidate solutions can be determined (step 406), for purposes of determining whether a predetermined condition (e.g., Pareto optimality, one or more conditional objective values exceeding a threshold value, etc.) has been achieved with regard to the conditional objectives. For example, taking an allocation in which three modules 20, each module having three virtual cells 30 and each virtual cell 30 having three positions 40 containing cell-fuse pairs 50 having capacity values according to the following arrays Module 1 {0.1, 0.1, 0.2, 0.2, 0.3, 0.2, 0.3, 0.4, 0.1}, Module 2 {0.2, 0.2, 0.2, 0.1, 0.3, 0.3, 0.3, 0.3, 0.3}, Module 3 {0.4, 0.2, 0.3, 0.3, 0.1, 0.2, 0.4, 0.2, 0.1}, are assigned to positions 40 in the virtual cells 30 in order based on their ordinal identifier in the array. Taking the first conditional objective (i.e., reduce (e.g., minimize) difference in capacity across virtual cells), the condition values are determined as follows: maximum capacity of module 1, virtual cell 1: 0.1+0.1+0.2=0.4; maximum capacity of module 1, virtual cell 2: 0.2+0.3+0.2=0.7; maximum capacity of module 1, virtual cell 3: 0.3+0.4+0.1=0.8. For module 2, maximum capacity of module 2, virtual cell 1: 0.2+0.2+0.2=0.6; maximum capacity of module 2, virtual cell 2: 0.1+0.3+0.3=0.7; maximum capacity of module 2, virtual cell 3: 0.3+0.3+0.3=0.9. For module 3, maximum capacity of module 3, virtual cell 1: 0.4+0.2+0.3=0.9; maximum capacity of module 3, virtual cell 2: 0.3+0.1+0.2=0.6; maximum capacity of module 3, virtual cell 3: 0.4+0.2+0.1=0.9. Thus, the maximum capacity of any virtual cell is 0.9, and the minimum capacity of any virtual cell is 0.4, for the candidate solution being considered under conditional objective one. To find the condition value, the difference in capacity (i.e., max-min) across all virtual cells: 0.9–0.4=0.5. Thus, for the candidate solution under consideration, the condition value is 0.5. The remaining condition values for each conditional objective and each candidate solutions can be computed in a similar manner using the equations given above.

According to some embodiments, for purposes of evaluation, the conditional objectives can be formulated into a weighted single objective configuration for purposes of evaluation, where weight for each of the conditional objectives can be specified by a user (e.g., via the user interface). For example, for the three conditional objectives noted above, taking a determined conditional objective value for each, a specific weight $\alpha_i>0$ can be multiplied for each conditional objective value for each candidate solution, and then added together. Creation of the weighted conditional objective value can be represented as shown at equation 8.

$$f_w = \alpha_1 f_1 + \alpha_2 f_2 + \alpha_3 f_3 \tag{8}$$

Each candidate solution (i.e., chromosome) of the initial population can then be represented via two arrays: $\{c_1, c_2, \ldots, c_L\}$ and $\{f_1, f_2, \ldots, f_L\}$ where $$c_i \in \{1, 2, \ldots, n_c\}, d_j \in \{1, 2, \ldots, n_f\} \text{ and } c_{i_1} \neq c_{i_2} \forall\, i_1, i_2; d_{j_1} \neq d_{j_2} \forall\, j_1, j_2$$

In other words, permutation among cells and permutation among fuses presents a candidate solution jointly. The corresponding conditional objective values of each candidate solution of the initial population (and the weighted value associated with each candidate solution) can then be stored for comparison with future generation population candidate solutions for determination of survivor solutions as described in greater detail below.

Following generation of the initial population and determination of condition values for each, genetic algorithm operators (e.g., crossover and/or mutation) can then be applied to generate future generations of new candidate solutions (step 408). According to some embodiments, a Non-Sorted Dominated Genetic Algorithm (NSGA-II) and its associated framework can be used to apply the operators, as described, for example, at K. Deb et al., "A fast and elitist multi-objective genetic algorithm: NSGA-II," in IEEE Transactions on Evolutionary Computation, vol. 6, no. 2, pp. 182-197, April 2002, the contents of which are herein incorporated by reference. This genetic algorithm has been developed in such way that the dimension of the solution space can be reduced (e.g., minimized), and allows problem specific solution representation and crossover and mutation operators in the multi-objective NSGA-II framework.

Figure 5A:
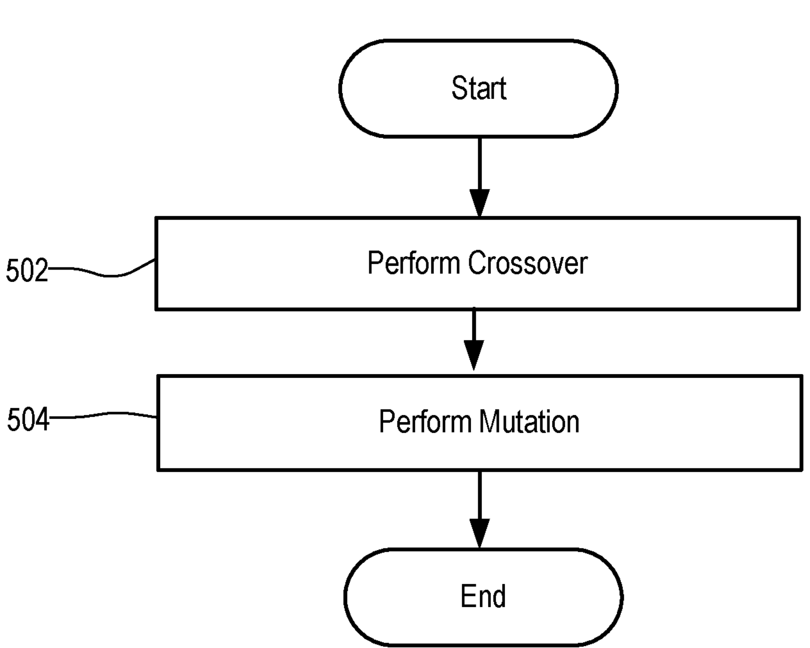
FIG. 5A is a flowchart illustrating a high-level overview of a breeding method of a genetic algorithm consistent with embodiments of the subject disclosure.

FIG. 5A is a flowchart 500 illustrating a high-level overview of a breeding method of a genetic algorithm consistent with embodiments of the subject disclosure. Crossover (e.g., two-point crossover) (step 502) and mutation (step 504) are two basic operators of genetic algorithms which can introduce new candidate solutions into a population to form a new generation. These operators can be applied in combination within one another, or can be selected to be implemented individually, as desired for a particular configuration.

Figure 5B:
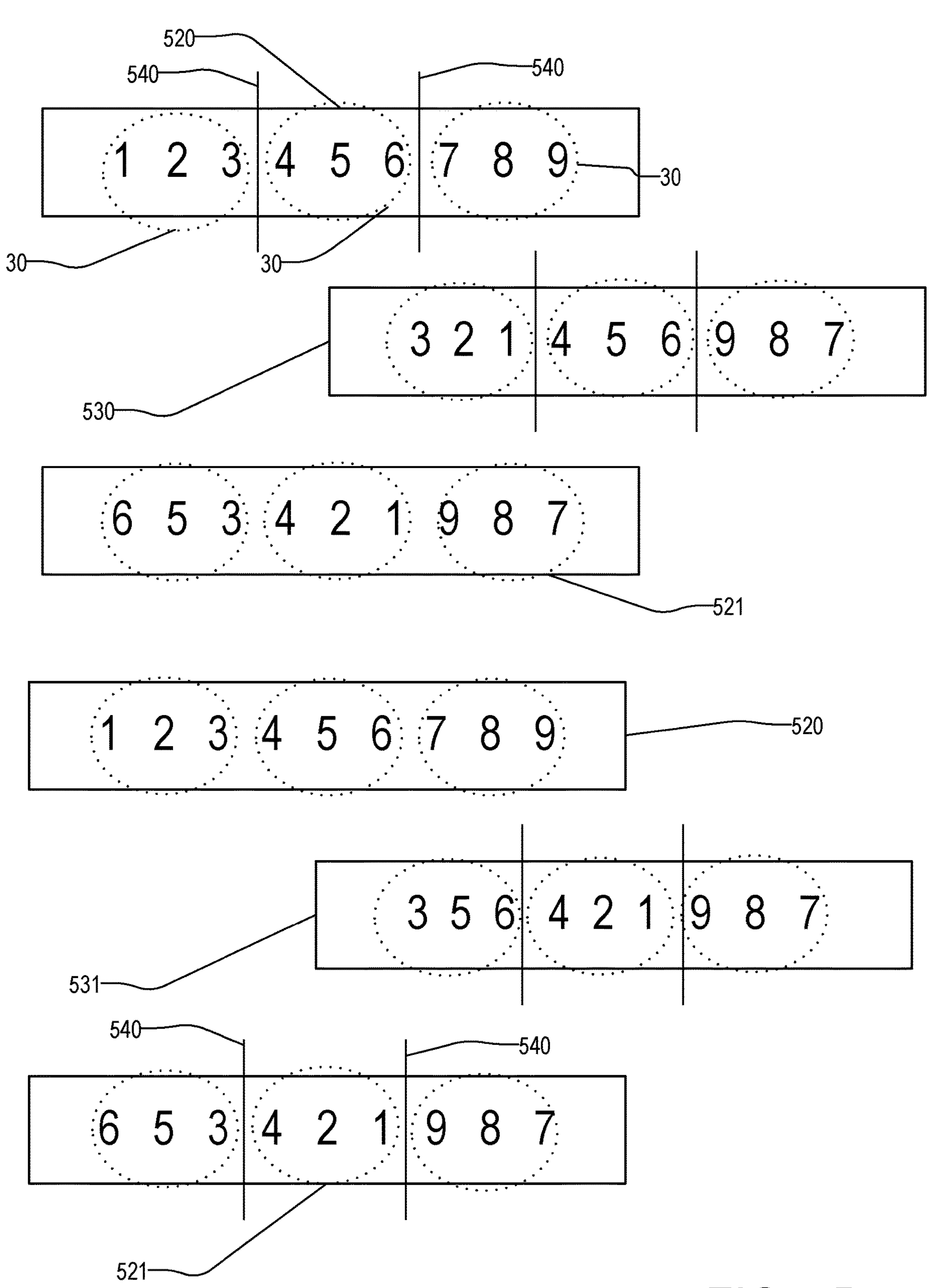
FIG. 5B shows an illustrative breeding operation for two candidate solutions of an initial population to produce a new candidate solution, according to embodiments of the subject disclosure.

FIG. 5B shows an illustrative breeding operation for two "parent" candidate solutions 520 and 521 of an initial population to produce a new "child" candidate solution 530, according to embodiments of the subject disclosure. In the subject embodiments, the assignments of cell-fuse pairs 50 to positions 40 is assumed to be as shown by the ordinal value of the cell-fuse pairs described above with regard to FIGS. 1-3. Thus, each of the parent solutions 520 and 521 include three virtual cells 30 having three positions 40, yielding nine total positions 40 to be filled by cell-fuse pairs 50. In other words, in the presently simplified example, a single battery module 20 is represented.

A two-point crossover operation has been implemented where two cut points 540 are randomly selected at the same positions in the two parent solutions 520 and 521 and two children (i.e., offspring) 530 and 531 are generated therefrom. according to the example shown, the cut points 540 have been randomly placed between virtual cells 30, however, this is illustrative only, and the two cut points 540 could also be placed so as to split one or more virtual cells 40, and to include cells (e.g., 4, 5, etc.) or fewer cells (e.g., 2). The steps of the two-point crossover can be described as 1) select two cut points 540 randomly between genes (i.e., properties) of each parent candidate solution; 2) select the cell-fuse pairs 50 between the two cut points 540 from first parent solution 520 and copy it to the child 1 at the same position; copy the remaining values from the second parent 521 placing them in the same position as in the parent, but omitting in sequential order any repeated values.

Notably, while two-point crossover has been implemented in the present examples, this implementation is not intended to be limiting, and other crossover types (e.g., single point crossover) can be implemented.

Figure 5C:
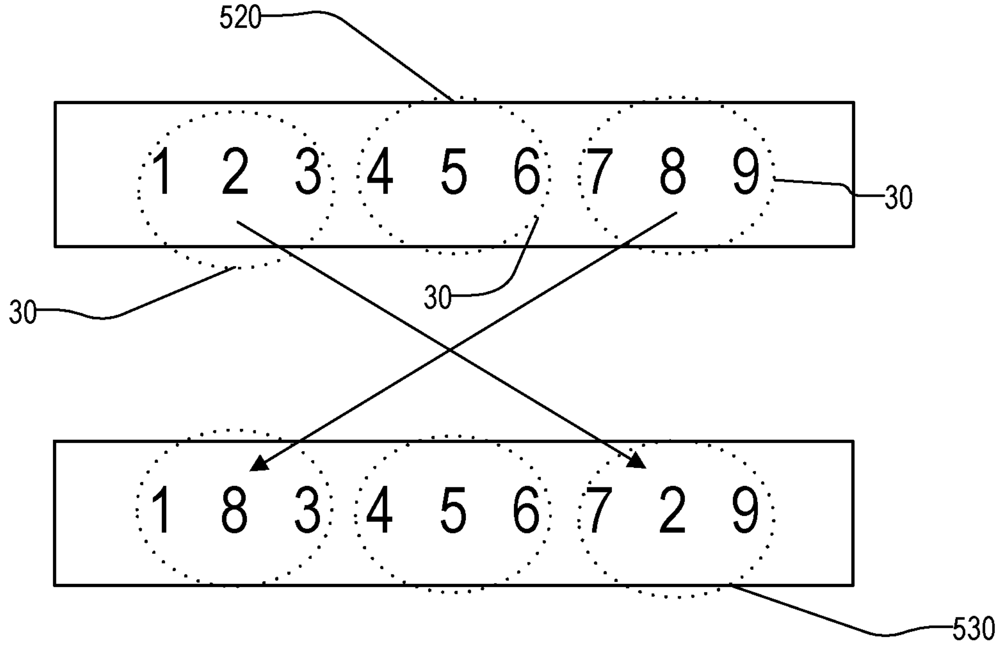
FIG. 5C shows another illustrative breeding operation for two candidate solutions of an initial population to produce a new candidate solution, according to embodiments of the subject disclosure.

FIG. 5C shows another illustrative breeding operation for two candidate solutions 520 and 521 of an initial population to produce a new candidate solution, according to embodiments of the subject disclosure. According to some embodiments, a mutation (e.g., swap mutation) can be used (step 504), in addition or alternatively to crossover, for generating new candidate solutions. Using such a swap mutation operator, the genetic algorithm can swap two arbitrarily selected cells (or fuses) within a single parent 520 to result in a new, mutated solution 530. Selection of cells for swapping can be performed on random or pseudo random basis. For example, second and eighth cells of parent 520 are selected randomly for swapping to generate mutated solution 530.

After calculation of each conditional objective value for a candidate solution, the weighted objective can be determined, and evaluated (e.g., compared) across each of the candidate solutions of a current population to determine survivor solutions for inclusion in the new population (step 410). According to embodiments of the subject disclosure, survivor solutions correspond to those candidate solutions having better weighted objective values than other candidate solutions in the same population.

An implementation of the NSGA-II algorithm noted above can be used to evaluate the population to determine whether the predetermined condition (e.g., Pareto optimality) has been achieved by any of the candidate solutions of the population. Determination of survivor solutions is based on ranking and selecting from the population using, for example, a non-dominance technique and a crowding distance. The following definitions are helpful for explaining steps of the NSGA-II algorithm Definition 1 (Dominance): for two solutions x1 and x2, x1 dominates x2 if solution x1 is no worse than x2 in all conditional objectives.

Definition 2 (Non dominated solutions) Given a set of solutions; the non-dominated solution set is a set of all the solutions that are not dominated by any member of the solution set.

Definition 3 (Pareto optimal set) The non-dominated set of the entire feasible decision space is called the Pareto-optimal set.

Definition 4 (Pareto optimal front) The boundary defined by the set of all points mapped from the Pareto optimal set is called the Pareto-optimal front.

The goal of the multi-objective configuration according to embodiments disclosed herein, is to determine a set of solutions which are both close to Pareto-optimal front as possible and as diverse as possible.

To do so, parent-child solutions can be ranked according to their non-domination order, and solutions with a rank of 1 dominate other solutions in parent-child solutions. If no rank 1 solutions can be identified, solutions with a rank of 2 can dominate the remaining solutions, with this methodology continuing downward in rank.

For example, four different fronts can be identified, with each population consisting of 6 solutions. Thus, according to the example, among 12 parent-child solutions, there can be 4 solutions with a rank of 1 and 3 solutions with a rank of 2. Therefore, 4 solutions with rank 1 are placed in a new generation population as survivor solutions. The NSGA II algorithm then selects 2 out of the 3 solutions with a rank of 2 according to their crowding distances. Crowding distance of a candidate solution can be defined by the semi-perimeter of a cuboid formed with neighboring solutions. Solutions which are determined to be less "crowded" (i.e., greater distance from other solutions of the same rank) are preferred and selected as the survivor solutions to be present in the subsequent generation population.

According to some embodiments, generation of one or more new candidate solutions from the breeding operations results in elimination of a corresponding number of previously existing candidate placement solutions of the population, such that the population size remains constant. Thus, when determining the survivor solutions for the new population according to step 410, the number of solutions designated as survivor solutions result in a corresponding number of less desirable candidate solutions (e.g., of rank 3 and below) being removed from the population such that population size (e.g., as input by a user) remains constant.

New generations can then be created iteratively using the genetic breeding techniques and randomly selected parent candidate solutions, and each generation can be evaluated as noted above to determine whether a desired condition has been met.

After each iteration, an iteration counter tracking the number of new generations created can be compared to a predetermined iteration value (e.g., as input by a user) (step 414). When the iteration counter indicates equal or greater number of iterations have been performed than the predetermined iteration value (step 414: yes), creation of new generations via genetic algorithm breeding can be stopped, and one or more survivor solutions having a suitable rank, as described above, are provided to a user (e.g., displayed via the user interface) (step 416). This data can then be used for building a battery according to the determined configuration. For example, the determined position assignments having a suitable rank can be provided to a battery manufacturer in a design specification for manufacturing a battery according to the position assignments.

Where the iteration count has not reached or exceeded the predetermined number of iterations (step 414: no), the genetic breeding can be undertaken once again with regard to the present generation for creation of a new generation of candidate solutions.

According to some embodiments an execution time limit can be set as an alternative or in addition to the iteration counter. In such embodiments, if the execution time reaches the preset execution limit before a solution satisfying the predetermined condition, or before the iteration counter has reached the preset iteration count, execution can end, and the one or more survivor solutions are provided to the user.

Figure 6:
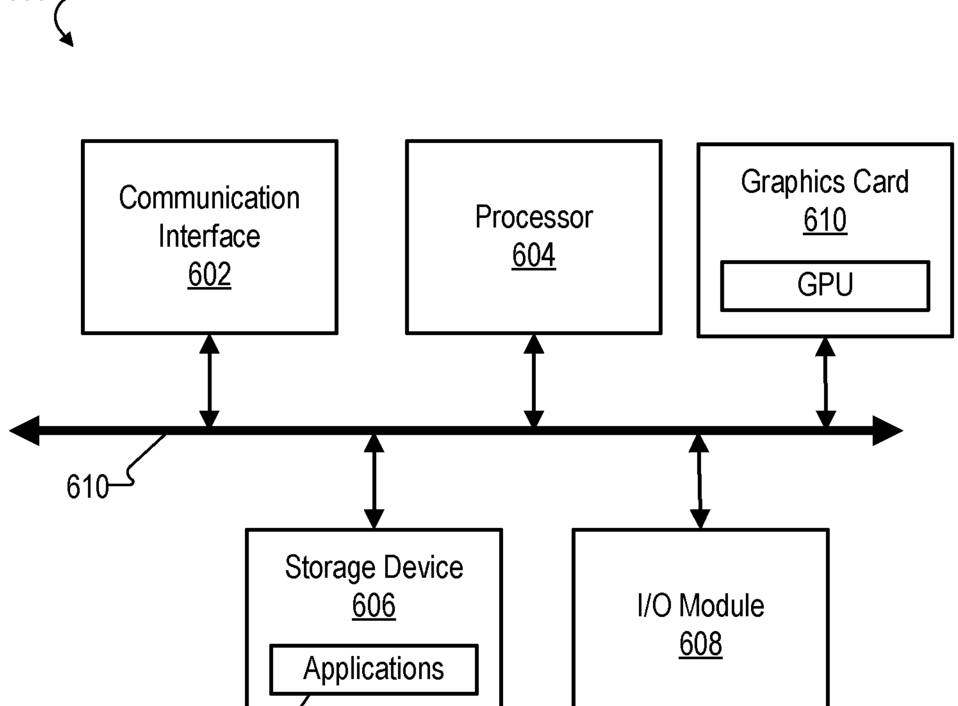
FIG. 6 shows an illustrative computing device that can be specifically configured to perform one or more of the processes described herein.

FIG. 6 shows an illustrative computing device 600 that can be specifically configured to perform one or more of the processes described herein. As shown in FIG. 6, computing device 600 can include a communication interface 602, a processor 604, a storage device 606, and an input/output ("I/O") module 608 communicatively connected via a communication infrastructure 610. While an illustrative computing device 600 is shown in FIG. 6, the components illustrated in FIG. 6 are not intended to be limiting. Additional or alternative components can be used in other embodiments.

Communication interface 602 can be configured to communicate with one or more computing devices. Examples of communication interface 602 include, without limitation, a wired network interface (such as a network interface card), a wireless network interface (such as a wireless network interface card), a modem, an audio/video connection, and any other suitable interface. Processor 604 generally represents any type or form of processing unit capable of processing data or interpreting, executing, and/or directing execution of one or more of the instructions, processes, and/or operations described herein. Processor 604 can direct execution of operations in accordance with one or more applications 612 or other computer-executable instructions such as can be stored in storage device 606 or another computer-readable medium. For example, processor 604 can be configured to receive cell and fuse data via the user interface (e.g., using I/O module 608), generate populations, determine condition values, generate new solutions from the population, and provide selected solutions, via, for example, I/O module 608.

Storage device 606 can include one or more data storage media, devices, or configurations and can employ any type, form, and combination of data storage media and/or device. For example, storage device 606 can include, but is not limited to, a hard drive, network drive, flash drive, magnetic disc, optical disc, RAM, dynamic RAM, other non-volatile and/or volatile data storage units, or a combination or sub-combination thereof. Electronic data, including data described herein, can be temporarily and/or permanently stored in storage device 606. For example, data representative of one or more executable applications 612 configured to direct processor 604 to perform any of the operations described herein can be stored within storage device 606. In some examples, data can be arranged in one or more databases residing within storage device 606.

I/O module 608 can include one or more I/O modules configured to receive user input and provide user output. One or more I/O modules can be used to receive input. I/O module 608 can include any hardware, firmware, software, or combination thereof supportive of input and output capabilities. For example, I/O module 608 can include hardware and/or software for capturing user input, including, but not limited to, a keyboard or keypad, a touchscreen component (e.g., touchscreen display), a receiver (e.g., an RF or infrared receiver), motion sensors, and/or one or more input buttons.

I/O module 608 can include one or more devices for presenting output to a user, including, but not limited to, a graphics engine, a display (e.g., a display screen), one or more output drivers (e.g., display drivers), one or more audio speakers, and one or more audio drivers. In certain embodiments, I/O module 608 is configured to provide graphical data to a display for presentation to a user. The graphical data can be representative of one or more graphical user interfaces and/or any other graphical content as can serve a particular implementation.

Thus, according to some embodiments, I/O module 608 can be configured to, for example, provide a user interface for receiving and/or importing cell and fuse data, as well as for outputting data related to candidate and survivor solutions, among others.

In implementations, the components of computer device 600 as described above need not be enclosed within a single enclosure or even located in close proximity to one another. Those skilled in the art will appreciate that the above-described componentry are examples only, as computer device 600 can include any type of hardware componentry, including any necessary accompanying firmware or software, for performing the disclosed implementations. Computer device 600 can also be implemented in part or in whole by electronic circuit components or processors, such as application-specific integrated circuits (ASICs) or field-programmable gate arrays (FPGAs).

In one or more examples, the functions described can be implemented in hardware, software, firmware, or any combination thereof. If implemented in software, functions described in the subject disclosure can be stored on or transmitted over a computer-readable medium as one or more instructions or code. Computer-readable media includes both tangible, non-transitory computer storage media and communication media including any medium that facilitates transfer of a computer program from one place to another. A storage media can be any available tangible, non-transitory media that can be accessed by a computer. By way of example, and not limitation, such tangible, non-transitory computer-readable media can comprise RAM, ROM, flash memory, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, DVD, floppy disk and Blu-ray disc where disks usually reproduce data magnetically, while discs reproduce data optically with lasers. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above should also be included within the scope of computer-readable media.

Further, the disclosure comprises embodiments according to the following clauses:

Clause 1. A computer system that determines cell-fuse pair placement in a multi-conditional battery configuration, the computer system comprising:

one or more hardware processors;

a non-transitory memory device communicatively connected to the one or more hardware processors and storing instructions that when executed by the one or more hardware processors cause the one or more hardware processors to execute operations comprising:

receiving cell data comprising one or more characteristic cell values related to each of a plurality of cells;

receiving fuse data comprising one or more characteristic fuse values related to each of a plurality of fuses;

generating a population comprising a plurality of candidate placement solutions for the multi-conditional battery configuration based on an initial sorted sequence of the cell data and the fuse data, each candidate placement solution comprising a plurality of battery modules, each battery module comprising a plurality of virtual cells, and each virtual cell comprising a plurality of positions at which a cell-fuse pair selected from the plurality of cells and the plurality of fuses is placed;

determining, for each virtual cell of each candidate placement solution of the population, a condition value for each condition of the multi-conditional battery configuration, the condition value being based on the characteristic cell values and the characteristic fuse values of the cell-fuse pairs placed in the positions of the virtual cell;

generating one or more new solutions from the population based on genetic algorithm breeding, for consideration as a survivor solution; and providing, to a user device, at least one of a selected survivor solution or a selected candidate placement solution corresponding to a cell-fuse pair placement configuration satisfying a predetermined condition based on the determined condition value for each condition of the multi-conditional battery configuration for each virtual cell.

Clause 2. The computer system of clause 1, wherein the one or more characteristic cell values include a cell capacity and a cell impedance, and wherein the one or more characteristic fuse values include a fuse impedance.

Clause 3. The computer system of clause 2, wherein a first condition of the multi-conditional battery configuration includes reduction of a capacity difference in cell capacity across all of the virtual cells, a second condition of the multi-conditional battery configuration includes reduction of a maximum difference in impedance within each of the virtual cells of the plurality of virtual cells, and a third condition of the multi-conditional battery configuration includes reduction of a battery impedance difference in impedance across all battery modules of the plurality of battery modules.

Clause 4. The computer system of any of clauses 1-3, wherein the genetic algorithm breeding includes at least one of a two-point crossover or a mutation performed between two of the plurality of candidate placement solutions.

Clause 5. The computer system of any of clauses 1-4, wherein the operations further comprise receiving a cell count, a module count, and a virtual cell count as input from the user device, wherein the cell count, the module count, and the virtual cell count are used for generating the plurality of candidate placement solutions.

Clause 6. The computer system of any of clauses 1-5, wherein sorting of the initial sorted sequence of the cell data and the fuse data is performed based on at least one of cell capacity, cell impedance, or fuse impedance.

Clause 7. The computer system of any of clauses 1-6, wherein a population size of the plurality of candidate placement solutions is predetermined and received as an initial input to the computer system.

Clause 8. The computer system of clause 7, wherein upon generation of the one or more new solutions, a corresponding number of previously existing candidate placement solutions of the population are deleted such that the population size remains constant.

Clause 9. The computer system of any of clauses 1-8, wherein the generating of the one or more new solutions is performed iteratively until the predetermined condition is satisfied for the population and/or a predetermined number of iterations have completed.

Clause 10. The computer system of any of clauses 1-9, wherein the operations further comprise:

determining, for each virtual cell of each of the one or more new solutions of the population, a modified condition value for each condition of the multi-conditional battery configuration, wherein the selected survivor solution is chosen from the one or more new solutions based on the determined modified condition values.

Clause 11. A method that determines cell and fuse placement in a multi-conditional battery configuration, the method comprising:

receiving cell data comprising one or more characteristic cell values related to each of a plurality of cells;

receiving fuse data comprising one or more characteristic fuse values related to each of a plurality of fuses;

generating a population comprising a plurality of candidate placement solutions for the multi-conditional battery configuration based on an initial sorted sequence of the cell data and the fuse data, each candidate placement solution comprising a plurality of battery modules, each battery module comprising a plurality of virtual cells, and each virtual cell comprising a plurality of positions at which a cell-fuse pair selected from the plurality of cells and the plurality of fuses is placed;

determining, for each virtual cell of each candidate placement solution of the population, a condition value for each condition of the multi-conditional battery configuration, the condition value being based on the characteristic cell values and the characteristic fuse values of the cell-fuse pairs placed in the positions of the virtual cell;

generating one or more new solutions from the population based on genetic algorithm breeding, for consideration as a survivor solution; and providing, to a user device, at least one of a selected survivor solution or a selected candidate placement solution corresponding to a cell-fuse pair placement configuration meeting a predetermined condition based on the determined condition value for each condition of the battery multi-conditional configuration for each virtual cell.

Clause 12. The method of clause 11, wherein the one or more characteristic cell values of each of the plurality of cells include a cell capacity and a cell impedance, and wherein the one or more characteristic fuse values of each of the plurality of fuses include fuse impedance.

Clause 13. The method of clause 12, wherein a first condition of the multi-conditional battery configuration includes reduction of a capacity difference in cell capacity across all of the virtual cells, a second condition of the multi-conditional battery configuration includes reduction of a maximum difference in impedance within each of the virtual cells of the plurality of virtual cells, and a third condition of the multi-conditional battery configuration includes reduction of a battery impedance difference in impedance across all battery modules of the plurality of battery modules.

Clause 14. The method of any of clauses 11-13, wherein the genetic algorithm breeding includes at least one of a two-point crossover or a mutation performed between two of the plurality of candidate placement solutions.

Clause 15. The method of any of clauses 11-14, further comprising receiving a cell count, a module count, and a virtual cell count as input from the user device, wherein the cell count, the module count, and the virtual cell count are used for generating the plurality of candidate placement solutions.

Clause 16. The method of any of clauses 11-15, wherein sorting of the initial sorted sequence of the cell data and the fuse data is performed based on at least one of cell capacity, cell impedance, or fuse impedance.

Clause 17. The method of any of clauses 11-16, wherein a population size of the plurality of candidate placement solutions is predetermined and provided as an initial input to the method.

Clause 18. The method of clause 17, further comprising, upon generation of the one or more new solutions, deleting a corresponding number of previously existing candidate placement solutions of the population such that the population size remains constant.

Clause 19. The method of any of clauses 11-18, further comprising iteratively generating the one or more new solutions until the predetermined condition is met for a candidate solution of the population or a predetermined number of iterations have completed.

Clause 20. The method of any of clauses 11-19, further comprising:

determining, for each virtual cell of each of the one or more new solutions of the population, a modified condition value for each condition of the multi-conditional battery configuration, wherein the selected survivor solution is chosen from the one or more new solutions based on the determined modified condition values.

The foregoing description is illustrative, and variations in configuration and implementation can occur to persons skilled in the art.

While the disclosure has been made with reference to examples of the implementations thereof, those skilled in the art will be able to make various modifications to the described implementations without departing from the true spirit and scope. The terms and descriptions used herein are set forth by way of illustration only and are not meant as limitations. In particular, although the processes have been described by examples, the stages of the processes can be performed in a different order than illustrated or simultaneously. Furthermore, to the extent that the terms "including", "includes", "having", "has", "with", or variants thereof are used in the detailed description, such terms are intended to be inclusive in a manner similar to the term "comprising." As used herein, the terms "one or more of" and "at least one of" with respect to a listing of items such as, for example, A and B, means A alone, B alone, or A and B. Further, unless specified otherwise, the term "set" should be interpreted as "one or more." Also, the term "couple" or "couples" is intended to mean either an indirect or direct connection. Thus, if a first device couples to a second device, that connection can be through a direct connection, or through an indirect connection via other devices, components, and connections.

The foregoing description of the disclosure, along with its associated examples, has been presented for purposes of illustration only. It is not exhaustive and does not limit the disclosure to the precise form disclosed.

All ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

What is claimed is:

1. A computer system that determines cell-fuse pair placement in a multi-conditional battery configuration, the computer system comprising:

one or more hardware processors;

a non-transitory memory device communicatively connected to the one or more hardware processors and storing instructions that when executed by the one or more hardware processors cause the one or more hardware processors to execute operations comprising:

receiving cell data comprising one or more characteristic cell values related to each of a plurality of cells;

receiving fuse data comprising one or more characteristic fuse values related to each of a plurality of fuses;

generating a population comprising a plurality of candidate placement solutions for the multi-conditional battery configuration based on an initial sorted sequence of the cell data and the fuse data, each candidate placement solution comprising a plurality of battery modules, each battery module comprising a plurality of virtual cells, and each virtual cell comprising a plurality of positions at which a cell-fuse pair selected from the plurality of cells and the plurality of fuses is placed;

determining, for each virtual cell of each candidate placement solution of the population, a condition value for each condition of the multi-conditional battery configuration, each of the condition values being individually weighted and based on the characteristic cell values and the characteristic fuse values of the cell-fuse pairs placed in the positions of the virtual cell;

generating one or more new solutions from the population based on genetic algorithm breeding, for consideration as a survivor solution; and providing, to a user device, a selected survivor solution corresponding to a cell-fuse pair placement configuration satisfying a predetermined condition based on the determined condition value for each condition of the multi-conditional battery configuration for each virtual cell.

2. The computer system of claim 1, wherein the one or more characteristic cell values include a cell capacity and a cell impedance, and wherein the one or more characteristic fuse values include a fuse impedance.

3. The computer system of claim 2, wherein a first condition of the multi-conditional battery configuration includes reduction of a capacity difference in cell capacity across all of the virtual cells, a second condition of the multi-conditional battery configuration includes reduction of a maximum difference in impedance within each of the virtual cells of the plurality of virtual cells, and a third condition of the multi-conditional battery configuration includes reduction of a battery impedance difference in impedance across all battery modules of the plurality of battery modules.

4. The computer system of claim 1, wherein the genetic algorithm breeding includes at least one of a two-point crossover or a mutation performed between two of the plurality of candidate placement solutions.

5. The computer system of claim 1, wherein the operations further comprise receiving a cell count, a module count, and a virtual cell count as input from the user device, wherein the cell count, the module count, and the virtual cell count are used for generating the plurality of candidate placement solutions.

6. The computer system of claim 1, wherein sorting of the initial sorted sequence of the cell data and the fuse data is performed based on at least one of cell capacity, cell impedance, or fuse impedance.

7. The computer system of claim 1, wherein a population size of the plurality of candidate placement solutions is predetermined and received as an initial input to the computer system.

8. The computer system of claim 7, wherein upon generation of the one or more new solutions, a corresponding number of previously existing candidate placement solutions of the population are deleted such that the population size remains constant.

9. The computer system of claim 1, wherein the generating of the one or more new solutions is performed iteratively until the predetermined condition is satisfied for the population and/or a predetermined number of iterations have completed.

10. The computer system of claim 1, wherein the operations further comprise:

determining, for each virtual cell of each of the one or more new solutions of the population, a modified condition value for each condition of the multi-conditional battery configuration, wherein the selected survivor solution is chosen from the one or more new solutions based on the determined modified condition values.

11. A method that determines cell and fuse placement in a multi-conditional battery configuration, the method comprising:

receiving cell data comprising one or more characteristic cell values related to each of a plurality of cells;

receiving fuse data comprising one or more characteristic fuse values related to each of a plurality of fuses;

generating a population comprising a plurality of candidate placement solutions for the multi-conditional battery configuration based on an initial sorted sequence of the cell data and the fuse data, each candidate placement solution comprising a plurality of battery modules, each battery module comprising a plurality of virtual cells, and each virtual cell comprising a plurality of positions at which a cell-fuse pair selected from the plurality of cells and the plurality of fuses is placed;

determining, for each virtual cell of each candidate placement solution of the population, a condition value for each condition of the multi-conditional battery configuration, each of the condition values being individually weighted and based on the characteristic cell values and the characteristic fuse values of the cell-fuse pairs placed in the positions of the virtual cell;

generating one or more new solutions from the population based on genetic algorithm breeding, for consideration as a survivor solution; and providing, to a user device, a selected survivor solution corresponding to a cell-fuse pair placement configuration meeting a predetermined condition based on the determined condition value for each condition of the battery multi-conditional configuration for each virtual cell.

12. The method of claim 11, wherein the one or more characteristic cell values of each of the plurality of cells include a cell capacity and a cell impedance, and wherein the one or more characteristic fuse values of each of the plurality of fuses include fuse impedance.

13. The method of claim 12, wherein a first condition of the multi-conditional battery configuration includes reduction of a capacity difference in cell capacity across all of the virtual cells, a second condition of the multi-conditional battery configuration includes reduction of a maximum difference in impedance within each of the virtual cells of the plurality of virtual cells, and a third condition of the multi-conditional battery configuration includes reduction of a battery impedance difference in impedance across all battery modules of the plurality of battery modules.

14. The method of claim 11, wherein the genetic algorithm breeding includes at least one of a two-point crossover or a mutation performed between two of the plurality of candidate placement solutions.

15. The method of claim 11, further comprising receiving a cell count, a module count, and a virtual cell count as input from the user device, wherein the cell count, the module count, and the virtual cell count are used for generating the plurality of candidate placement solutions.

16. The method of claim 11, wherein sorting of the initial sorted sequence of the cell data and the fuse data is performed based on at least one of cell capacity, cell impedance, or fuse impedance.

17. The method of claim 11, wherein a population size of the plurality of candidate placement solutions is predetermined and provided as an initial input to the method.

18. The method of claim 17, further comprising, upon generation of the one or more new solutions, deleting a corresponding number of previously existing candidate placement solutions of the population such that the population size remains constant.

19. The method of claim 11, further comprising iteratively generating the one or more new solutions until the predetermined condition is met for a candidate solution of the population or a predetermined number of iterations have completed.

20. The method of claim 11, further comprising:

determining, for each virtual cell of each of the one or more new solutions of the population, a modified condition value for each condition of the multi-conditional battery configuration, wherein the selected survivor solution is chosen from the one or more new solutions based on the determined modified condition values.

* * * * *